United States Patent [19]
Sandstrom

[11] Patent Number: 5,440,426
[45] Date of Patent: Aug. 8, 1995

[54] OPTICAL SPATIAL FILTERING FOR ATTENUATING THE ZERO DIFFRACTIVE ORDERS OF MUTUALLY INCOHERENT LIGHT BEAMS

[76] Inventor: Erland T. Sandstrom, Banvägen 56, S-435 43 Mölnlycke, Sweden

[21] Appl. No.: 274,525

[22] Filed: Jul. 13, 1994

Related U.S. Application Data

[63] Continuation of Ser. No. 36,201, Mar. 23, 1993, abandoned.

[30] Foreign Application Priority Data

Mar. 23, 1994 [EP] European Pat. Off. ............ 92105002

[51] Int. Cl.$^6$ .............................................. G02B 27/46
[52] U.S. Cl. .................... 359/559; 250/550; 355/53; 359/564; 359/562
[58] Field of Search ............ 250/550; 359/558, 559, 359/562, 564; 355/53

[56] References Cited

U.S. PATENT DOCUMENTS

| | | | |
|---|---|---|---|
| 2,687,670 | 8/1954 | Locquin | 359/370 |
| 2,699,092 | 1/1955 | Rantsch | 359/370 |
| 3,604,806 | 9/1971 | Redman | 250/550 |
| 3,703,724 | 11/1972 | Thomas . | |
| 3,771,129 | 11/1973 | McMahon | 250/550 |
| 3,870,414 | 3/1975 | Duffy | 359/559 |
| 3,904,295 | 9/1975 | Hock et al. . | |
| 3,972,616 | 8/1976 | Minami et al. | 359/370 |
| 4,035,068 | 7/1977 | Rawson | 359/599 |
| 4,245,909 | 1/1981 | Loos | 359/559 |
| 4,299,443 | 11/1981 | Minami et al. | 359/559 |
| 4,338,030 | 7/1982 | Loos | 359/559 |
| 4,528,448 | 7/1985 | Doggett | 250/550 |
| 4,644,516 | 5/1987 | Coppa et al. | 359/559 |
| 4,873,653 | 10/1989 | Grosskopf | 359/371 |
| 4,947,413 | 8/1990 | Jewell et al. | 359/559 |
| 5,168,157 | 12/1992 | Kimura | 359/371 |
| 5,253,110 | 10/1993 | Ichihara et al. | 359/371 |
| 5,264,912 | 11/1993 | Vaught et al. | 359/559 |

FOREIGN PATENT DOCUMENTS 0496891  8/1992  European Pat. Off. .

OTHER PUBLICATIONS

"Spatial Filtering for Depth of Focus and Resolution Enhancement in Optical Lithography," by H. Fukuda et al., Journal of Vacuum Science & Technology B, 9 (1991) Nov./Dec., No. 6, New York, pp. 3113-3116.

*Primary Examiner*—Martin Lerner
*Attorney, Agent, or Firm*—Keck, Mahin & Cate

[57] ABSTRACT

Method and apparatus for forming an image of an object by optical projection with a focusing system comprising the steps of collimating a set of at least two mutually incoherent light beams from the light source to fall on the object from directions that makes the non-diffracted components intersect the aperture stop at a set of points that are distributed over the surface of the stop, attenuating in a spatial filter the zero diffraction order of each beam relative to diffraction orders diffracted in directions towards the centre of the aperture stop, and adding the images formed by the light beams.

12 Claims, 7 Drawing Sheets

*Prior Art*

OPTICAL SPATIAL FILTERING FOR ATTENUATING THE ZERO DIFFRACTIVE ORDERS OF MUTUALLY INCOHERENT LIGHT BEAMS

This is a continuation of application Ser. No. 08/036,201, filed Mar. 23, 1993, now abandoned.

BACKGROUND OF THE INVENTION

1. Field of The Invention

The present invention relates to a new method for improvement of optical imaging. In particular the invention applies to the production of integrated circuits by projection lithography.

2. Description of the Related Art

A transparent mask is illuminated by a light source and the light transmitted by the mask is projected by a lens system to form an image on the wafer. The resolution of the system depends on the wavelength and on the numerical aperture of the lens. Present production of 16 megabyte dynamic RAM memories uses i-line (365 nm wavelength) illumination and a projecting lens with an NA of 0.40–0.5.

For the next generation 64 Mb DRAM, there are a number of options to increase resolution: shorter wavelength, higher NA, and so-called phase-shift masks. All of these are difficult to implement.

Shorter wavelength means excimer laser light source with increased operating costs, uncertain reliability and new resist processes. Higher NA requires flatter wafers, new resist technology (so-called top-surface imaging resist) and projection lenses with flatter field. Phase-shifting masks pose new problems since they are difficult to make and even worse to inspect and repair.

SUMMARY OF THE INVENTION

The disclosed invention gives a fourth way to increase the resolution: to modify the optics of the projection system in order to get the same resolution as with phase-shift masks, but with regular chrome-only masks. The modifications to the optics are simple and the cost of implementing them is low. The use of the invention will be of economic benefit to the electronic industry and to society in general.

The invention also relates to microscopy where the invention effectively doubles the resolution of any microscope. This is important in any type of microscopy, but particularly for measurement microscopes used for optical linewidth measurement.

BRIEF DESCRIPTION OF THE DRAWINGS

The following description of the preferred embodiments will refer to the Drawings of this specification, wherein.

DETAILED DESCRIPTION OF THE PREFERRED EMBODIMENTS

Basic principle

Figure 1:
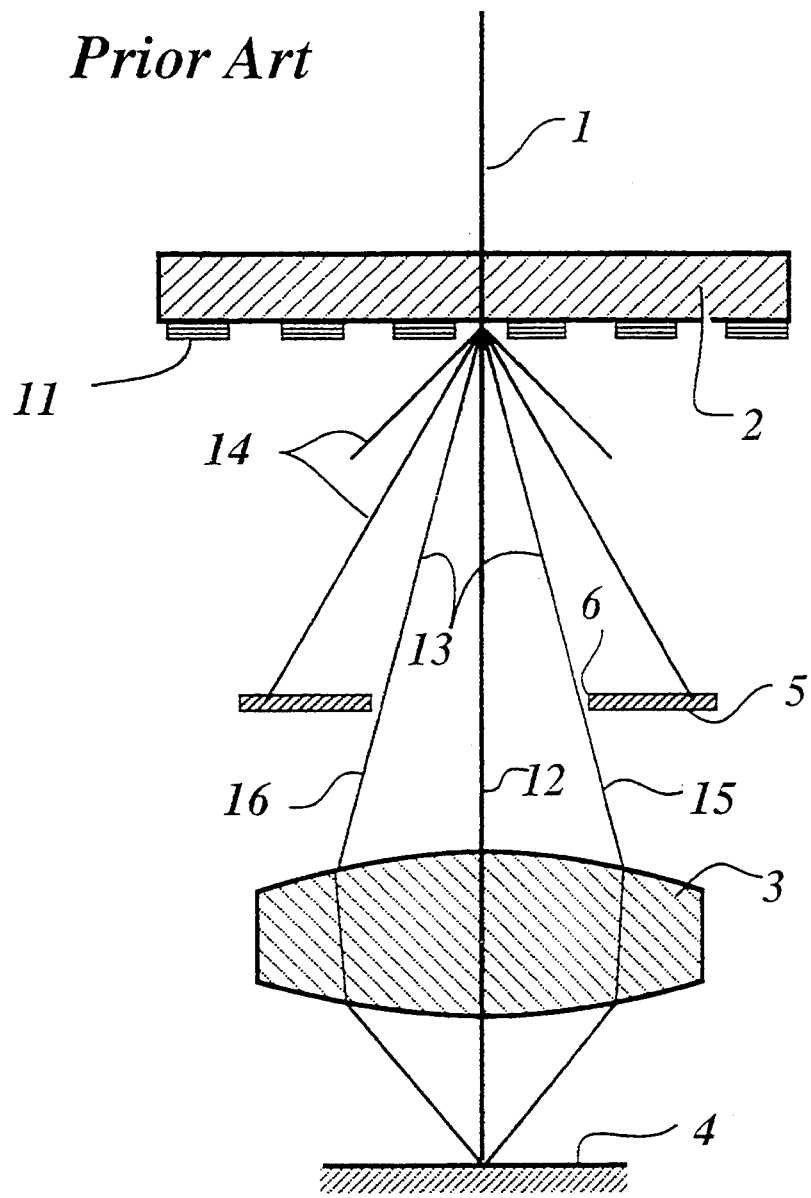
FIG. 1(a) shows a conventional imaging system with coherent illumination along the optical axis and a grating object near the resolution limit.
FIG. 1(b) is similar to FIG. 1(a), but with oblique illumination.
FIG. 1(c) is similar to FIG. 1(b), but with a spatial filter to attenuate the zero diffraction order.
FIG. 1(d) is similar to FIG. 1(c), but with an object with a finer grating pattern.
Figure 1:
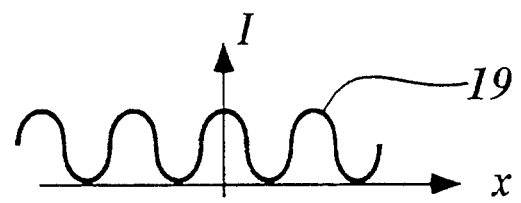
Figure 1:
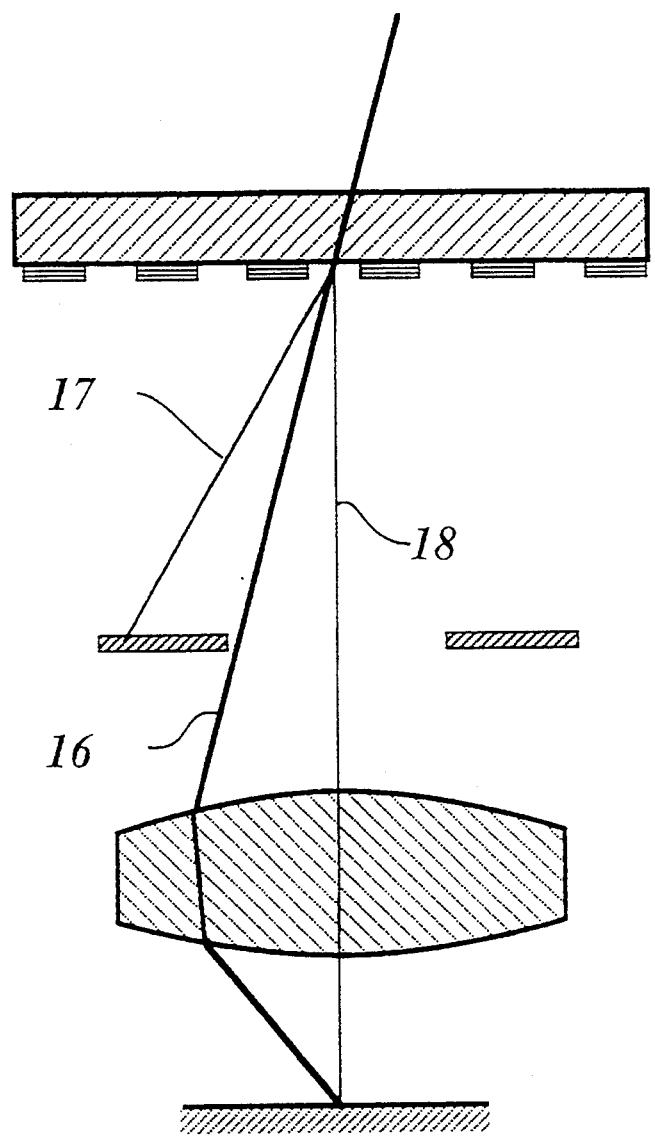
Figure 1:
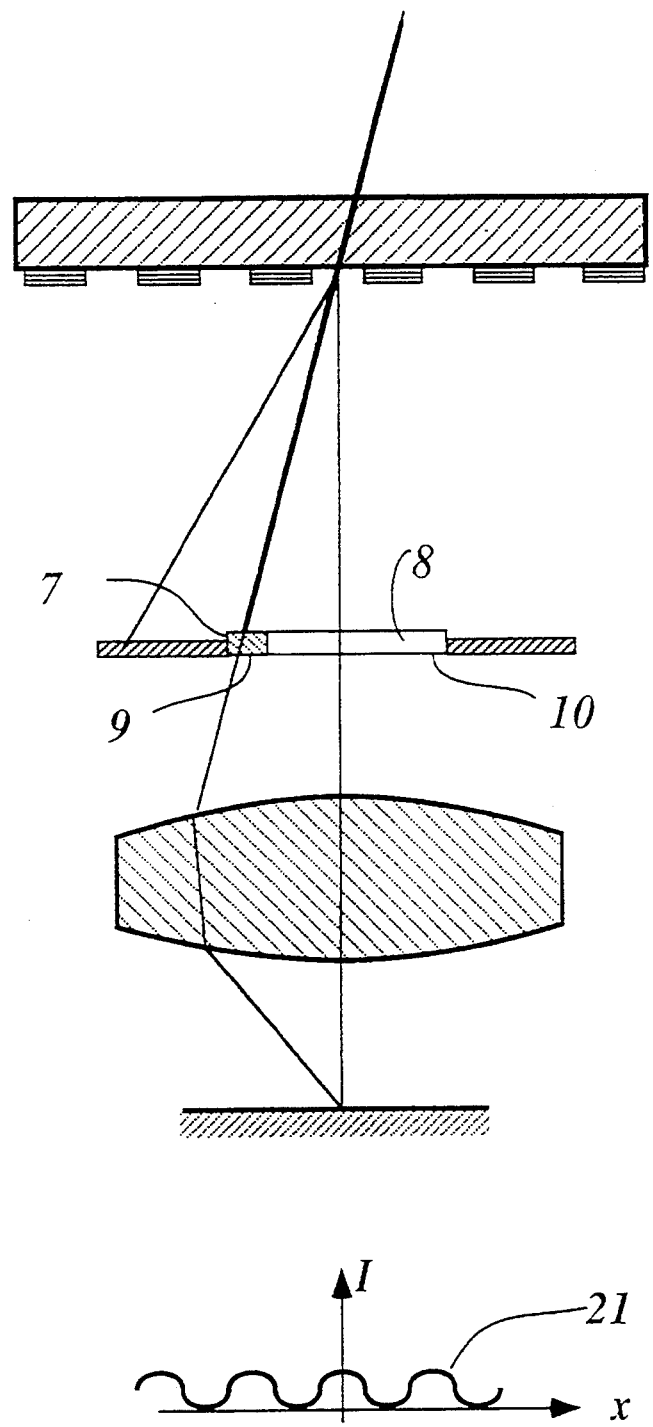
Figure 1:
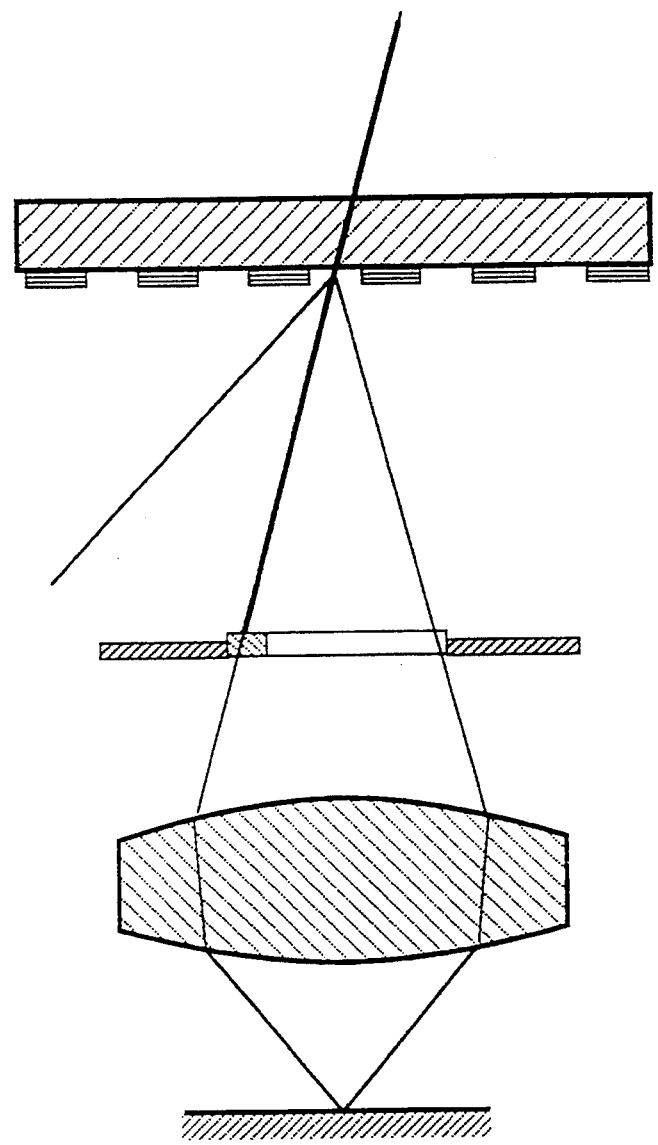
Figure 1:
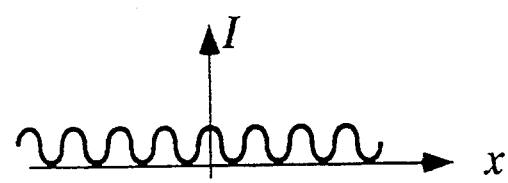

The invention relates to an optical projection system, FIG. 1(a), that has a light source, a condenser system for bringing said light 1 to the object 2 (in lithography the mask), a projection lens 3 for projecting the image of the object to an image plane 4. The image plane is sensitive to the light energy, being either a photosensitive surface or a detecting device. The projection lens has a back focal plane 5 with an aperture stop 6 determining the NA of the lens. FIG. 1 is simplified by the omission of the light source, the condensor, and the field lenses that are normally present in a projection system. It shows a demagnifying system but the description applies equally well to a system where the image is larger than the object.

It is useful to describe the illumination by the light distribution in the plane of the aperture stop, since any direction of the incident light at the object or mask corresponds to a point in that plane. In the invention, FIG. 1(c), the illumination is arranged so that the light after passing the object hits the aperture stop near its edge 7. (This is in contrast to a conventional system where the light fills a circular area centered on the aperture stop with a radius normally in the range 0.5–1.2 of the radius of the stop.) In the invention there is also at the aperture stop a spatial filter 8, i.e. a glass plate with different phase and amplitude transmission in different parts of the aperture. The invention uses an attenuator 9 with an amplitude transmission that is less than unity and larger than zero where the beam hits the stop and the transmission over the rest of the surface 10 is essentially unity. The exact transmission of the attenuator depends on a trade-off between the imaging properties for the different feature sizes and has to be determined by experiments or by detailed calculations, but it is in the range of 15 and 75% and typically between 25 and 50%.

This can be explained as follows: When there is a fine pattern 11 on the mask the beam is partly transmitted undiffracted 12 (diffraction order 0), partly diffracted in other directions 13, 14 (diffraction orders −1, +1, −2, +2, −3 . . . ). The information of the pattern is contained in the diffracted orders, and an image is formed at the image plane where the projection lens combines the diffracted orders and makes them interfere with each other. If all orders including order 0 reach the image plane, the image is a perfect reproduction of the mask. With pattern element sizes near the resolution limit of the system, some of the orders 14 are blocked by the aperture stop and some information is lost. The image 19 is then less sharp than the ideal image. The diffracted orders are diffracted in symmetrical pairs so that a +1 order 15 corresponds to a=1 order 16 of the same amplitude, but in general different phase and at the opposite side of the zero order 12. A conventional system is symmetrical so both plus and minus orders are brought to the image plane.

With oblique illumination, FIG. 1(b), the order zero 16 is made to fall near the edge of the aperture stop. Placing the zero order at the edge destroys the image quality, however. If a plus order component 17 falls inside the open area of the stop, the minus order 18 will be blocked. There is an unbalanced reconstruction of the pattern at the image plane and contrast is lost 20. The invention, FIG. 1(c), uses a partly transmitting spatial filter 7 that attenuates the zero order so that the reminder is in balance with the diffraction orders passing the aperture stop. The overall intensity is decreased, but the contrast is restored 21.

FIG. 1(d) shows the benefit. The resolution is increased because diffracted components with a larger angle to the zero order will pass the aperture stop when the zero order is near the edge. The angle is directly proportional to the number of lines per millimeter on the mask. The resolution is increased despite the fact that the same lens and same NA is used in both cases. Therefore the depth of focus is not affected. The resolution in FIG. 1(d) is exactly twice that of FIG. 1(a), but in a real system the illumination has a spread of angles that the comparison is less direct.

Figure 2:
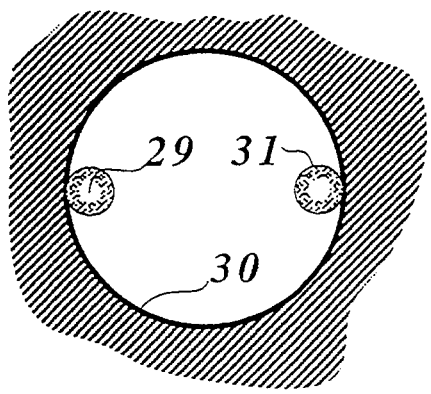
FIG. 2(a) is a view of the aperture stop with two beams with matching attenuators for increased resolution along one axis. The attenuator is the shaded area and the illumination the light spot within it.
FIG. 2(b) shows annular illumination and an annular attenuator.
FIG. 2(c) shows seven beams with matching attenuators.
FIG. 2(d) shows a rotating single beam with a co-rotating spatial filter.
FIG. 2(e) is similar to FIG. 2(d), but with an apodiasation phase-shifter in the clear area of the spatial filter.
Figure 2:
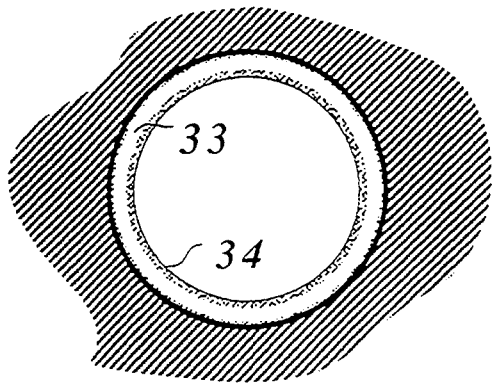
Figure 2:
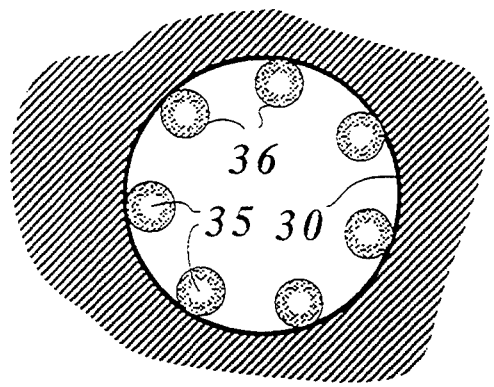
Figure 2:
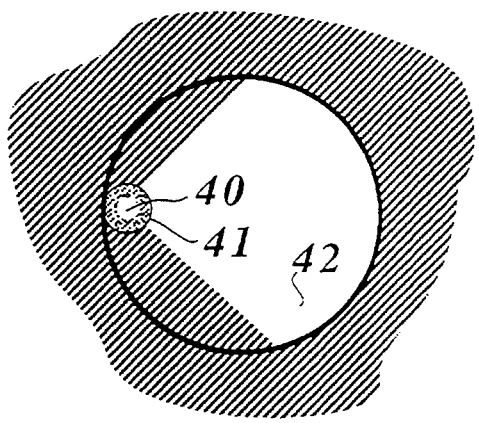
Figure 2:
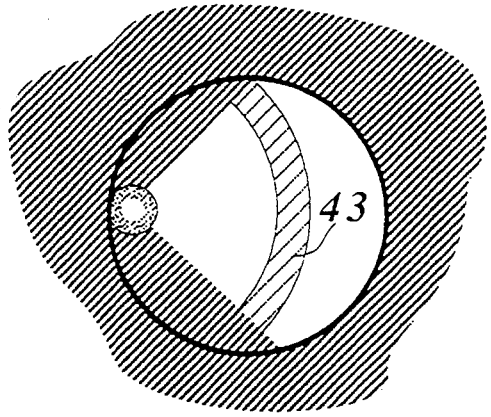

A problem that arises is that illumination at one edge 29 of the stop 30, FIG. 2(a), gives a highly asymmetrical image. In particular the image is distorted in a complex manner when the object is slightly out of focus. In order to get symmetry we must add to the image another image formed with the illumination and spatial filter at the opposite side of the stop 31. This can be done by simultaneous illumination in the two directions by two incoherent beams, or by making two sequential exposures.

Furthermore, the arrangement in FIG. 1(c)–(d) and FIG. 2(a) gives increased resolution only in one direction. To make the image symmetrical in the x and y axes, at least four incident directions or exposures are needed. The most simple method is to use annular illumination and an annular partial transmitting filter, as shown in FIG. 2(b). Preferably, the illumination shall form a thin ring 33 of light close to the edge of the stop and the spatial filter consist of a ring of attenuator 34. The function depends on mutual incoherence between the illuminations at different points along the ring so that the function is equivalent to several non-interfering beams hitting several points along the perimeter of the ring.

FIG. 2(c) shows another way of accomplishing isotropic imaging. The light falls at several (typically four or more) spots 35 near the edge 30 and a spatial filter with several attenuation areas 36 matched to the light source is used. With four spots there is a symmetry in both x and y directions, eight spots give the same symmetry also to the diagonal axes, and gives a highly isotropic image. The spots would be mutually incoherent, i.e. using separate light sources, or a single light source with a path difference larger than the coherence length, or having a common coherent source and a coherence scrambler in each incident beam. The most simple way to assure incoherence is to illuminate the different angles sequentially.

The invention can be described in optical terms as an incoherent superposition of two or more images formed at oblique illumination and filtered by a spatial filter with the transmission for the zero diffraction order of 15% to 75% of the transmission of orders diffracted towards the optical axis. The superposition can be instantaneous by simultaneous exposure by mutually incoherent light beams, by integration of consecutive exposures in the photosensitive device, or by numerical integration of separately captured images.

Rotating illumination and filter

Figure 3:
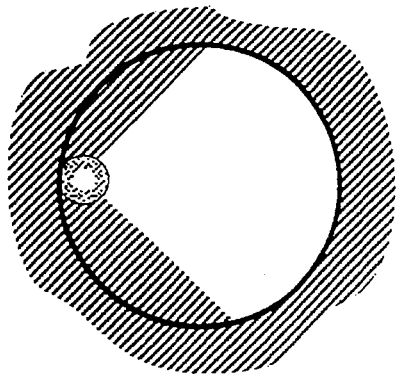
FIG. 3(a) shows one position of the rotating illumination and spatial filter in FIG. 2(d)
FIG. 3(b) shows the illumination and filter rotated 180 degrees. The incoherent addition of the images formed in FIGS. 3(a) and (b) gives an image with high resolution in the horizontal plane.
FIG. 3(c) shows the filter rotated for high resolution in the vertical direction.
FIG. 3(d) shows the filter rotated for high resolution in the diagonal direction.
Figure 3:
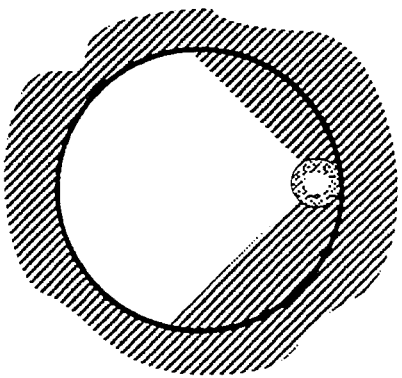
Figure 3:
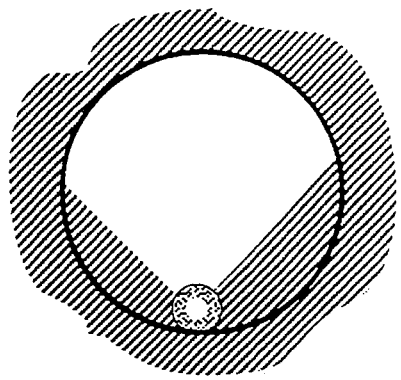
Figure 3:
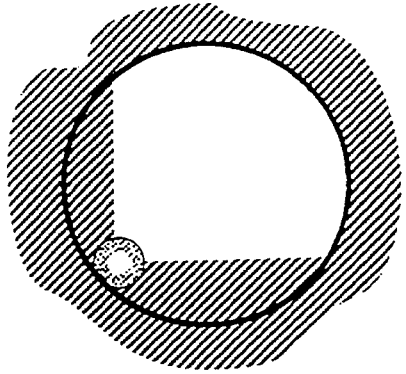

A higher degree of optimization can be obtained if the illumination and the spatial filter are made to rotate around the centre of the aperture stop, as shown in FIG. 3(d). Typically, the light forms a spot at or near the edge of the spot and a matched filter is used. Both the light spot and the filter are made to rotate in synchronicity. The spatial filter can now have a clear area that is not circular but typically forms a sector from the illumination spot to the opposite side of the stop. The zero order spot is, as described above, attenuated by a patch of attenuator. There are several parameters that can be determined experimentally: the angle of the sector, the attenuation of the attenuator, the size of the illumination spot, and the size of the attenuator. Preliminary calculations show that a sector angle of 90 degrees and a transmission at the attenuator of 25% give a good contrast of all line sizes down to the cut-off resolution. It is possible to change the modulation transfer function to optimize contrast at a particular resolution or to get equal imaging for all sizes by changing the shape of the clear area. Furthermore, it is possible to use several filters interchangeably for printing several linewidths in the same stepper.

The light illuminating different positions along the edge of the stop should be non-interfering. Either the illumination can be non-coherent and simultaneous, or it can be coherent and illuminate only one position at a time. The latter is particularly suited for excimer laser sources that are pulsed by their nature. One can then rotate the illumination point by a mirror system and the spatial filter in concordance, and at predetermined positions e.g. at regular 45 degree intervals, a pulse is shot. Of course the illumination can also be non-coherent and sequential, e.g. a flash tube or arc lamp physically moving in a circle at the back focal plane of the condensor lens.

Rotation has to be interpreted in a broad sense, since it is possible to make an implementation using stationary parts, such as liquid crystal light valves. What is important is that the geometry of the filter and illumination goes through a sequence, deterministic or random, of shapes or positions that differ in that one is a rotated version of the other, as shown in FIG. 3(a)-(d).

Performance

Wafer steppers operate at a linewidth determined by the formula:

$$s = k_1 * \lambda / NA.$$

The factor $k_1$ is an empirical factor involving the resolution of the optics, but also many subtle factors such as wafer flatness and resist contrast. For conventional production $k_1$ is 0.7-0.8. For phase-shift masks one has $k_1 = 0.35$-0.50 depending on the shape of the pattern elements. The present invention is predicted by calculations to give $k_1 = 0.35$-0.45 and is much less shape-dependent than phase-shift masks. It should be noted that it is in general not possible to use phase-shift masks together with the invention. In an abstract sense, conventional imaging has a hidden potential for twice the resolution that is normally obtained, and phase-shift masks and the present invention are two different ways to obtain this doubled resolution.

TABLE 1

| Wavelength | Linewidth | |
|---|---|---|
| NA = 0.5 | convent. | invention |
| | $k_1 = 0.8$ | $k_1 = 0.45$ |
| $\lambda = 365$ nm | 0.58 μm | 0.32 μm |
| $\lambda = 248$ | 0.39 | 0.21 |
| $\lambda = 193$ | 0.30 | 0.17 | linewidth using conventional and new lithography.
Estimates are conservative.

In microscopy, we have the resolution formula:

$$s = 0.61 * \lambda / NA.$$

The invention is estimated to increase the resolution by 70%. This compares very favourably with confocal microscopes that offer a resolution increase of 30%. The following table shows resolutions at visible, and at HeNe and HeCd laser wavelengths.

TABLE 2

| Wavelength | Resolution | | |
|---|---|---|---|
| NA = 0.92 | convent. | confocal | invention |
| $\lambda$ = visible | 0.37 μm | 0.28 μm | 0.22 μm |
| $\lambda = 632$ nm | 0.43 | 0.33 | 0.25 |
| $\lambda = 325$ | 0.22 | 0.17 | 0.13 | resolution using conventional, confocal and new microscopy.
Estimates are conservative.

There are other ways to use the invention. In order to achieve a predetermined resolution goal the invention allows a smaller NA to be used. This gives more depth of focus, a larger field of view, or a simpler optical design with fewer elements.

The proposed invention has one draw-back. Between 50 and 75% of the incident light is lost, either diffracted outside of the aperture stop or absorbed in the attenuator. This is considered to be a relatively minor problem compared to the benefits of the invention.

Optimization

Figure 4:
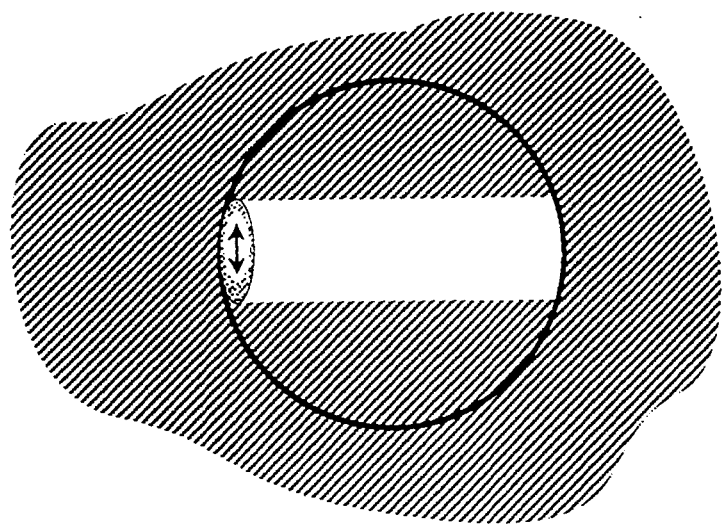
FIG. 4(a) shows spatial filter for optimum resolution along one axis only. The image formed by only 0 and 180 degree rotations of this configuration has the highest possible resolution in the horizontal direction, while the filter in FIG. 2(d) is intended for near-optimum resolution in all directions.
FIG. 4(b) shows stationary filter that gives near-optimum resolution for lines along the x and y axes and approximately 70% of that resolution for diagonal lines.
Figure 4:
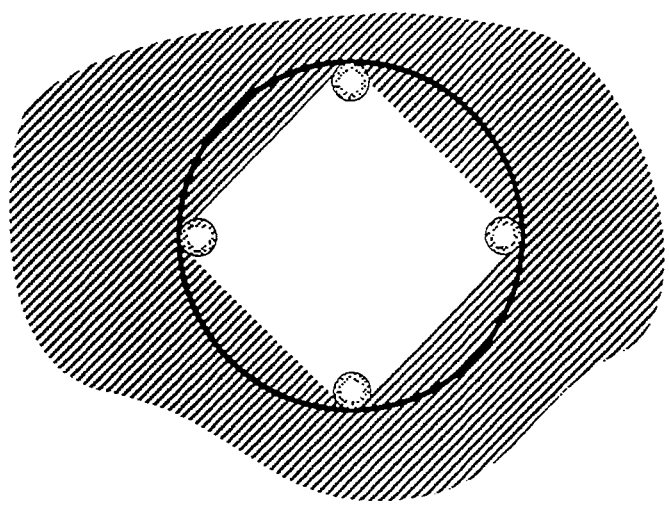

The angular spread of each beam, the size and attenuation of the attenuator, and the shape of the clear area all influence the image properties and have to be optimized differently in different applications. A wafer stepper printing narrow lines can be optimized for highest contrast of narrow lines along the x and y axes. This gives less contrast at larger features and at oblique lines and it also gives fringes along the edges of larger features. FIG. 2(d) and 4(b) show suitable illuminations and filters.

In a general-purpose microscope it is more important to get uniform resolution in all directions and to reduce fringes along edges of features. The latter is done by decreasing the contrast at the highest spatial features to get a gradual roll-off of contrast with spatial frequency, i.e. by increasing the angular spread of each beam and by changing the shape of the clear area. FIG. 2(b) and FIG. 2(d) with a much larger illumination spread and attenuator are suitable choices.

In an automatic line-width measurement system the resolution along one angle at a time should be optimized. FIG. 4(b) shows a filter and illumination for this case.

Further ways to improve the image

Variation of the phase and amplitude transmission in a radial fashion over the surface of the aperture stop, so called apodisation, is sometimes used in conventional imaging to tailor the point-spread function at the image plane. In particular, it is possible to increase resolution and/or depth of focus at the expense of contrast. The lithographic process requires much less contrast than photographic applications of imaging, and it may be possible to gain a few percent resolution by varying the phase over the part of the filter that is described above as clear. FIG. 2(e) shows a region 43 of the spatial filter with a phase delay to achieve apodisation.

It is well known that when a polarized beam is brought to a focus by a high-NA lens, the resolution is higher across the polarization vector than along it. The rotating scheme above allows the polarization vector to rotate with the illuminator so that the polarization of the zero order is always tangential in the aperture stop. For high-NA lenses this gives several percent increased resolution.

Preferred Embodiments

A preferred embodiment of a wafer stepper has a light source with a collimating lens making the light essentially parallel. A mirror directs the light toward the object. A mechanism makes this mirror rotate in a fashion that makes the direction beam trace a cone in the object plane. At the aperture plane of the projection lens there is a rotating disk with a spatial filter with a partly absorbing area and a clear area. The disk rotation is synchronized to the rotation of the mirror so that the non-diffracted beam always hits the absorbing area. During one exposure the mirror and spatial filter rotate a full turn.

A new element needed compared to conventional techniques is the spatial filter. The attenuator can be made with a thin metal film on glass such as nichrome or chrome. A semitransparent film has a phase-shift compared to the bare glass surface. To remove any phase difference between the attenuated and non-attenuated areas either area can have a deposited film or material can be etched away from the glass surface. Most practical is to deposit a film on top of the metal to make the total phase retardation 360 degrees compared to bare glass. Both films are then removed where the filter should be clear. Completely opaque areas are easily made by metal deposition or by a mash of metal sheet. The transmission is easily tested by measuring transmitted light, and the phase homogeneity by an interferometer. We believe that the spatial filter can be produced at a lower cost than a single phase-shift mask.

The main problem connected to the implementation of the invention is to make a vibration-free mechanism for rotation of the incident light and spatial filter. There is no critical alignment, so the illuminator including a moving-mirror assembly can be mechanically isolated from the wafer-stepper. The rotating spatial filter can be rotating on air bearings and driven by a contact-free induction motor and position feedback can be obtained by an optical transducer.

Implementation in a microscope

A microscope can either be built with stationary annular illumination and filter, or with the rotating illumination/spatial filter arrangement. In the latter case, the rotation can either be a true mechanical rotation or the same effect can be obtained by stationary means such as liquid crystal light valves. With liquid crystal valves it is possible to rotate so fast that the eye does not see any flicker but a stationary image is obtained. It is also possible to have a number of flash tubes mounted in the back focal plane of the collimator and flash them in sequence, so that each flash tube creates an exposure at a particular incident angle.

At the high NAs used in microscopy, it is very important to always use the best polarization state, shown by an arrow in FIG. 4(a). Another application where the ability to use only one polarization state is the study of structures hidden under dielectric films. The polarization state that is radial at the aperture stop suffers less reflection at the film surface and thus enhances the visibility of hidden structures.

Most image-enhancing techniques used in ordinary microscopes can be used together with the increased resolution, e.g. phase-contrast, interference, and interference contrast. That interference works together with the invention means that it is possible to use a so-called phase-stepping Linnik or Mireau interferometer set-up to gain accurate depth information within the high-resolution image. Dark-field imaging cannot be used, since the invention uses a predetermined mixture of bright-field and dark-field. At present it is uncertain whether any type of confocal scanning can be combined with the invention.

In a microscope where the image is captured with a video camera, digitized, and analyzed by computer, it is possible either to take one exposure using the complete set of rotations, or to take one exposure for each position and make the summation in software. The latter scheme circumvents certain trade-off relations inherent in isotropic imaging and allow the data in each image to be analyzed with optimum resolution in one direction. In this way the resolution along one axis at a time can be effectively doubled compared to conventional images. This is of great importance for linewidth measurements that are by definition one-dimensional. FIG. 4(a) shows a spatial filter suitable for optimum resolution in one direction. The transfer function is close to the theoretical function $\sin(x)/x$, and the image can be enhanced by digital deconvolution, i.e. a numerical technique where a known transfer function is removed and the ideal image without diffraction blur is computed. Furthermore, is possible to compute a two-dimensional image with optimum resolution in all directions if several images with the filter rotated for optimum resolution in different directions are combined. It should be pointed out that these numerical methods for image enhancement are ultimately limited by the noise of the system, but that considerable enhancement is possible, particularly if some prior knowledge about the object exists.

An interesting notion is that a comparison of the Fourier transforms of the intensity distributions for two exposures with the illumination rotated 180 degrees between them gives very sensitive information of focus errors. The resolution is only limited by noise and sensitivities below 0.1 $\mu$m are feasible.

FIG. 4(b) shows a stationary filter with four illumination angles that achieve resolution close the optimum along the x and y axes and better than conventional imaging in the diagonal directions.

Some of the filters are difficult to apply in the back focal plane of the lens in an incident-light microscope since the light has to pass the aperture stop twice. The back focal plane can also be inaccessible inside the lens. An image of the aperture stop can be formed closer to the eye-piece or camera and the filtering done in this image. This is also a suitable way of retro-fitting existing microscopes with a rotating spatial filter attachment.

Alternate Embodiments

The invention is defined by the optical principle of incoherent addition of several images formed at oblique incidence and with an attenuated zero order. Other ways of implementing or using the same optical principle are considered to be included in the invention. An example is the application to other types of electromagnetic radiation. Wherever the description refers to transmission it can be replaced by reflection, e.g. a reflecting object or a reflecting spatial filter. The image plane is considered to be any plane where an image of the object is formed, and the plane of the aperture stop can be exchanged for other planes that are re-imaged onto the aperture plane or where an image of the aperture plane is formed. Although a correct design for uniform imaging over an extended field requires the spatial filter to be placed at the aperture plane, it is possible to place the spatial filter in another plane where the zero diffraction order is separated from other diffraction orders. This is also covered by the invention as defined by the claims. It is possible that in an implementation of the invention there is no actual aperture stop, but that the spatial filter itself has the function of the aperture stop. It is then possible to relate the description above and the claims to a virtual aperture stop being the smallest circle centered on the optical axis at the back focal plane of the projection lens that enclose all light beams reaching the image. This equivalent aperture stop determines the used NA of the lens just as a physical aperture stop does.

Optical theory allows a beam, coming from an incoherent light source, that is spread out in the aperture plane to be treated as several mutually incoherent beams. When this invention teaches the use of two or more mutually incoherent beams it should be interpreted in this functional sense, not in a strictly geometrical sense where a beam is geometrically separated from another beam. Thus FIG. 2(b) shows a larger number of incoherent beams, although they together form a continuous light distribution. Any ambiguities can be resolved by optical theory where the notion of coherence is unambiguously defined.

The attenuator is described as a homogeneous absorbing area, but a transmission mask with opaque and transparent areas within an area determined by the lateral coherence distance in the plane of the spatial filter is considered to be an equivalent embodiment.

An implementation with a mixture of imaging according to the invention and conventional imaging, so that only part of the mutually incoherent light beams are subject to attenuation of the zero-diffraction order by a spatial filter, is considered to be within the invention if the light flux of the filtered beams is more than half of the total flux when the measurement of the fluxes are made at the object plane.

What is claimed is:

1. A method for increasing the resolution of an optical projection system comprising the steps of:
    illuminating an object with light from an illumination source;
    providing a back focal plane of the projection system and an image plane;
    providing at the back focal plane a non-symmetrical spatial filter having an optical axis;
    recording an image which comprises the sum of a plurality of partial images at the image plane produced by at least four sequential partial exposures in which the object is illuminated from at least four different oblique directions symmetrically arranged in relation to the optical axis; and
    rotating the geometry of the spatial filter around the optical axis such that a constant geometrical relation between the oblique illumination beam and the optical axis of the spatial filter is maintained.

2. A method as set forth in claim 11, wherein the light from said illumination source creates a non-diffracted light beam in the partial exposures which is attenuated by an attenuating area of the spatial filter with a transmission in the range 15 to 75%.

3. A method as set forth in claim 2, wherein the light from said illumination source is linearly polarized with a polarization vector, said rotation step including the substep of rotating the spatial filter between partial exposures such that a constant geometrical relation between the oblique illumination beam, the spatial filter, and the polarization vector is maintained for each exposure.

4. A method as set forth in claim 2, wherein the object is a photomask and the image is recorded in a photoresist.

5. A method as set forth in claim 2, wherein the illumination source is a laser.

6. A method as set forth in claim 2, wherein the spatial filter has a substantially clear area bounded by a bounding contour having an apex with an angle in the range 45–120 degrees.

7. A method as set forth in claim 6, wherein the light from said illumination source creates a non-diffracted light beam in each partial exposure which is attenuated by an attenuating area located at the apex of the bounding contour of the spatial filter.

8. A method as set forth in claim 1, wherein the spatial filter has a substantially clear area bounded by a bounding contour having an apex with an angle in the range 45–120 degrees.

9. A method as set forth in claim 8, wherein the light from said illumination source creates a non-diffracted light beam in each partial exposure which is attenuated by an attenuating area located at the apex of the bounding contour of the spatial filter.

10. A method as set forth in claim 1, wherein the light from said illumination source is linearly polarized with a polarization vector, said rotation step including the substep of rotating the spatial filter between partial exposures such that a constant geometrical relation between the oblique illumination beam, the spatial filter, and the polarization vector is maintained for each exposure.

11. A method as set forth in claim 1, wherein the object is a photomask and the image is recorded in a photoresist.

12. A method as set forth in claim 1, wherein the illumination source is a laser.

* * * * *